(12) United States Patent
Lippmann et al.

(10) Patent No.: US 7,350,934 B2
(45) Date of Patent: Apr. 1, 2008

(54) ILLUMINATED DISPLAY SYSTEM

(75) Inventors: Raymond Lippmann, Howell, MI (US); Gail M. Sylvester, Frankenmuth, MI (US); Michael E. Fye, Kokomo, IN (US); Tim A. Kenworthy, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 68 days.

(21) Appl. No.: 11/122,196

(22) Filed: May 3, 2005

(65) Prior Publication Data

US 2006/0250813 A1 Nov. 9, 2006

(51) Int. Cl.
*F21S 4/00* (2006.01)
(52) U.S. Cl. ........................ 362/224; 362/556; 362/559
(58) Field of Classification Search ................ 362/224, 362/556, 559, 570, 23, 26, 27, 551, 554; 200/317, 314; 361/600, 139; 40/547
See application file for complete search history.

(56) References Cited

U.S. PATENT DOCUMENTS

| | | | |
|---|---|---|---|
| 4,489,227 A | | 12/1984 | Lamarche |
| 5,039,854 A | * | 8/1991 | Yip et al. .................... 250/586 |
| 5,521,342 A | | 5/1996 | Bartley et al. |
| 5,668,913 A | * | 9/1997 | Tai et al. ..................... 385/146 |
| 5,938,324 A | * | 8/1999 | Salmon et al. .............. 362/555 |
| 2002/0122683 A1 | | 9/2002 | Kamei et al. |
| 2003/0099116 A1 | | 5/2003 | Nousiainen |
| 2003/0173198 A1 | | 9/2003 | Hanahara et al. |
| 2004/0136099 A1 | | 7/2004 | Kim et al. |
| 2004/0202001 A1 | * | 10/2004 | Roberts et al. ............. 362/494 |
| 2005/0002170 A1 | * | 1/2005 | Jacobs et al. ................. 362/23 |
| 2005/0036273 A1 | * | 2/2005 | Rastegar et al. ............ 361/600 |
| 2005/0111233 A1 | * | 5/2005 | Vezard et al. ............... 362/552 |
| 2006/0024002 A1 | * | 2/2006 | Roth et al. .................... 385/88 |

FOREIGN PATENT DOCUMENTS

EP 1447694 8/2004

* cited by examiner

*Primary Examiner*—Jong-Suk (James) Lee
*Assistant Examiner*—Julie A. Shallenberger
(74) *Attorney, Agent, or Firm*—Jimmy L. Funke (57) ABSTRACT

An illuminated display system is disclosed. The illuminated display system includes a circuit board with a front surface and a rear surface, and a plurality of light-passing holes. At least one light pipe is arranged on the rear surface of the circuit board. The at least one light pipe includes at least one entrance port and a plurality of corresponding facets and exit ports. Each of the plurality of facets, exit ports, and light passing holes are aligned in a corresponding relationship to the location of individual components of a display surface positioned over the front surface of the circuit board.

17 Claims, 6 Drawing Sheets

ILLUMINATED DISPLAY SYSTEM

FIELD OF THE INVENTION

The invention relates to illuminated display systems and more particularly to an illuminated display system utilizing light pipes that direct light to a display panel.

BACKGROUND OF THE INVENTION

It is known in the art that illuminated display systems, such as those found in receivers, compact disc players, and heating, ventilation, and air conditioning (HVAC) controllers, include a back-lit display panel. Typically, it has been common practice to locate light pipes between a printed circuit board and the display panel to direct light from a light source to a portion of the display panel for controlled illumination. However, because this location of the light pipe is typically shared by other electrical components and mechanical structures (i.e. button bodies, potentiometers, plastic ribs, LCD displays, etc.), the design of the light pipe may become complex, which may affect the efficiency of the lighting system.

Accordingly, a final design of the light pipe has often included complex structures that weave between the electrical components and mechanical structure. Once light is provided to an entrance port of the light pipe, gradual changes in direction of light propagation by means of total internal reflection on non-parallel light pipe walls tend to introduce losses as collimation decreases. Losses in collimation also increase the difficulty in directing light exiting the light pipe to the specific areas of the display panel.

The complexity of such light pipe designs makes computer simulation difficult and time consuming, which lends to prevention of design optimization by means of iterative prototyping and expensive design cycles drawn out with proof of concept often being delayed until injection molded light pipe prototypes can be produced. As such, a need exists for improving the collimation effects and efficiency of light pipes applied in an illuminated display system.

BRIEF DESCRIPTION OF THE DRAWINGS

The inventors of the present invention have recognized these and other problems associated with conventional illuminated display systems. The present invention will now be described, by way of example, with reference to the accompanying drawings, in which.

DESCRIPTION OF THE PREFERRED EMBODIMENT

The above-described disadvantages are overcome and a number of advantages are realized by an inventive illuminated display system, which is shown generally in FIGS. 1A-6. As illustrated, the illuminated display system includes a sub-structure 10 defined by a circuit board 12 and one or more light pipes 14a-14d that are positioned on a rear surface 12b (FIG. 1A) of the circuit board 12. In general, the positioning of the one or more light pipes 14a-14d on the rear surface 12b increases light utilization because of the absence of electrical components and mechanical structure (not shown), which is typically located on a front surface 12a (FIG. 1B) of the circuit board 12. Any obstructions on the rear surface 12b are minimized so as to increase the ability to propagate light, L (FIG. 3), from an entrance port 20 to one or more corresponding facets 22 of the light pipe 14a-14d with minimal changes in the direction of the light, L. Essentially, each light pipe 14a-14d minimizes de-collimation to reduce losses while maintaining a high degree of efficiency for light, L, that is propagated to a display surface 50 (FIG. 6) positioned over and adjacent to the front surface 12a of the circuit board 12.

Figure 2A:
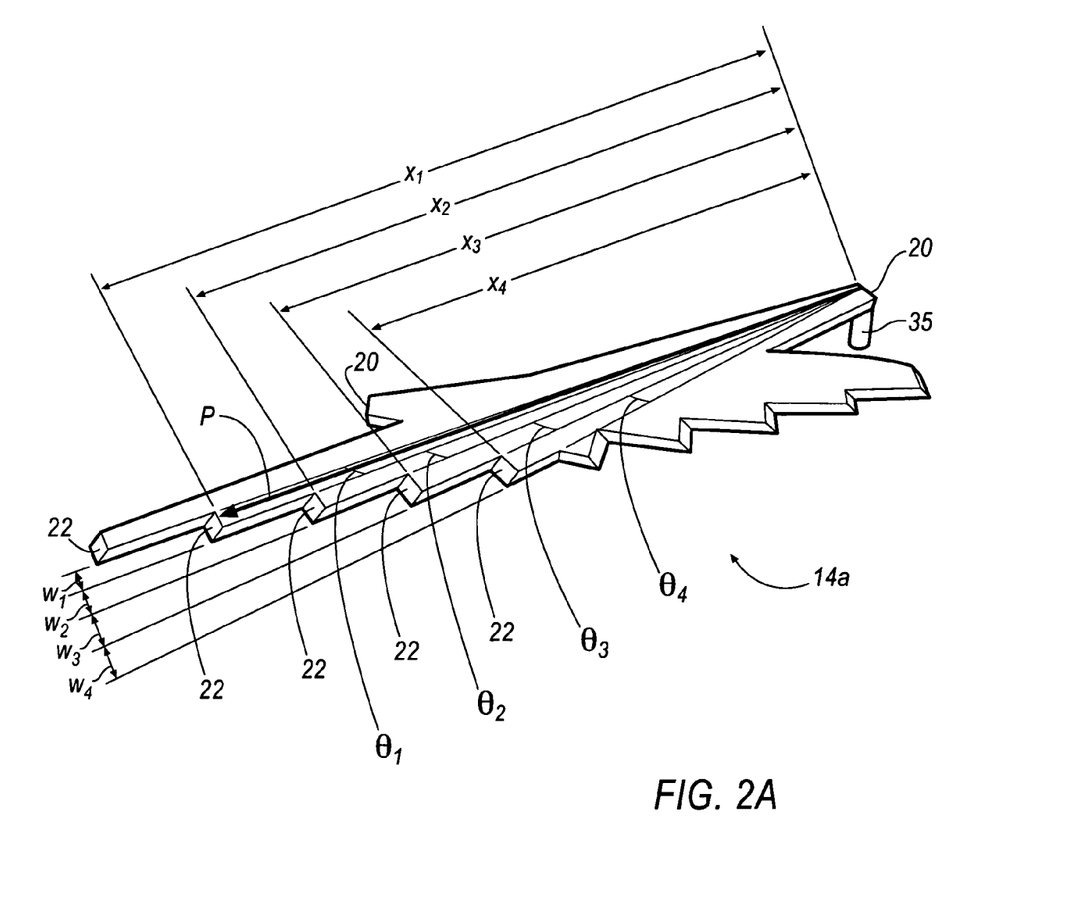
FIG. 2A is a rear view of a light pipe according to an embodiment.
Figure 2B:
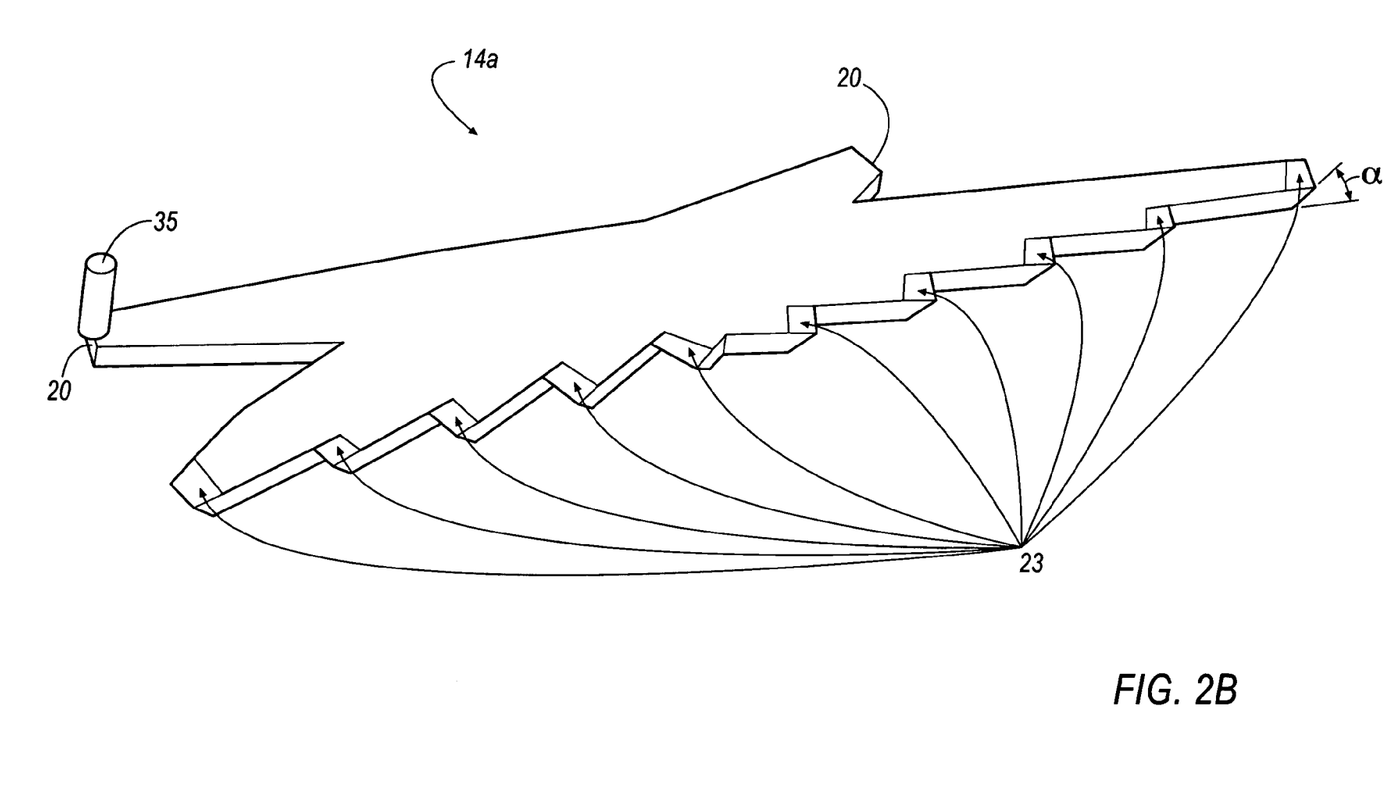
FIG. 2B is a front view of a light pipe according to an embodiment.

As illustrated, each light pipe 14a-14d may have any desirable shape and configuration, such as, for example, substantially flat wedge portions 16 and branches 18 of transparent plastic. A flat on the vertex of each wedge portion 16 defines the entrance port 20, which corresponds to one or more facets 22 in a generally opposing relationship. As illustrated, each light pipe 14a-14d may include any desirable number of entrance ports 20 and facets 22. Referring to FIG. 2A, the light pipe 14a, for example, includes two entrance ports 20 and ten facets 22 such that one entrance port 20 corresponds to five opposing facets 22. Referring to FIG. 2B, each facet 22 corresponds to an exit port 23, which, in the simplest case, is located on the opposite side of the light pipe 14a, directly above each facet 22. In some light pipe designs, such as those found in the light pipes 14c and 14d, an exit port 23 corresponds to an internal facet 28. In the case where a riser 32 is employed, a corresponding exit port 35 is found atop the riser 32. Referring to FIG. 2B, each facet 22 includes a facet angle, α, to direct light at the exit port 23 in a controlled manner to the display surface 50. The facet angle, α, may be any angle that would reflect the light in the desired direction and is typically bound by a range approximately equal to 40°-55°.

According to the illustrated embodiment in FIGS. 2A and 2B, each facet 22 also includes various widths, $W_1$-$W_4$, and path lengths, $X_1$-$X_4$, which are referenced from the corresponding entrance port 20. Ideally, the design of the light pipe 14a avoids blocking the line-of-sight 24 (FIG. 3) of one facet 22 by another. When the facets 22 are close to each other on an angular positioning basis in view of the location of the entrance port 20, the light pipe 14a may resemble a solid wedge such that the light, L, from a light source 26 leaving from any angle in the plane of the light pipe 14a intercepts a facet 22.

Peak light flux from the light source 26 is emitted in the direction of arrow, P, which is shown in FIG. 2A. The arrow, P, is normal to the emitting surface of the light source 26, and the amount of light flux decreases as the angle from the normal arrow, P, increases. To compensate for the angular drop-off of flux, subtended angles $\theta_2$-$\theta_4$ increase accordingly from the first subtended angle, $\theta_1$. According to the illustrated embodiment, typical values for the subtended angles, $\theta_1$-$\theta_4$, range from 1°-6°; however, values for the subtended angles, $\theta_1$-$\theta_4$, may range higher and lower than the range described above.

Figure 3:
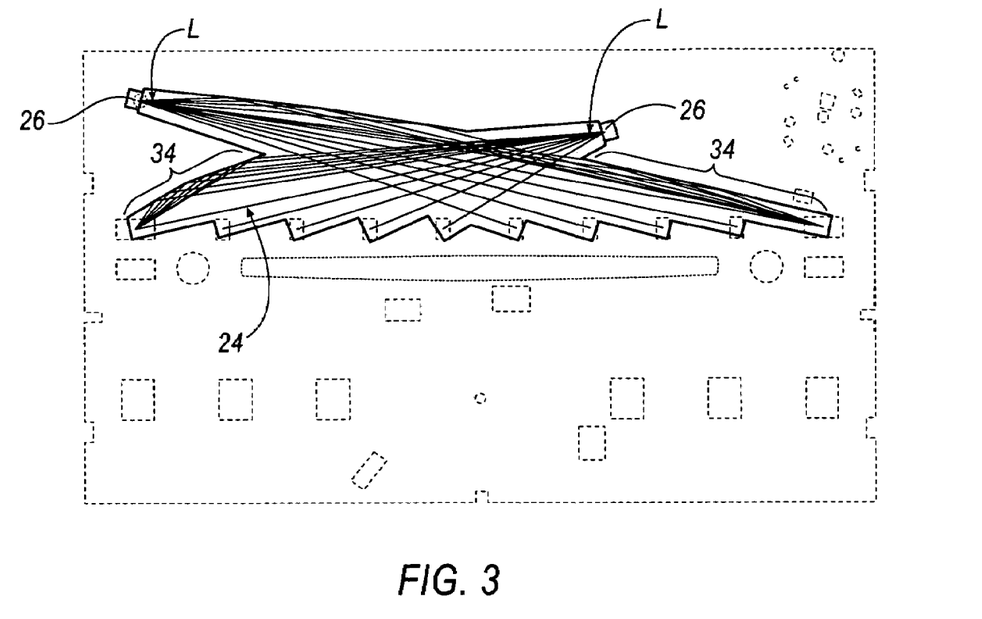
FIG. 3 illustrates the total internal reflection line of sight of the light pipe according to FIG. 2A.
Figure 4:
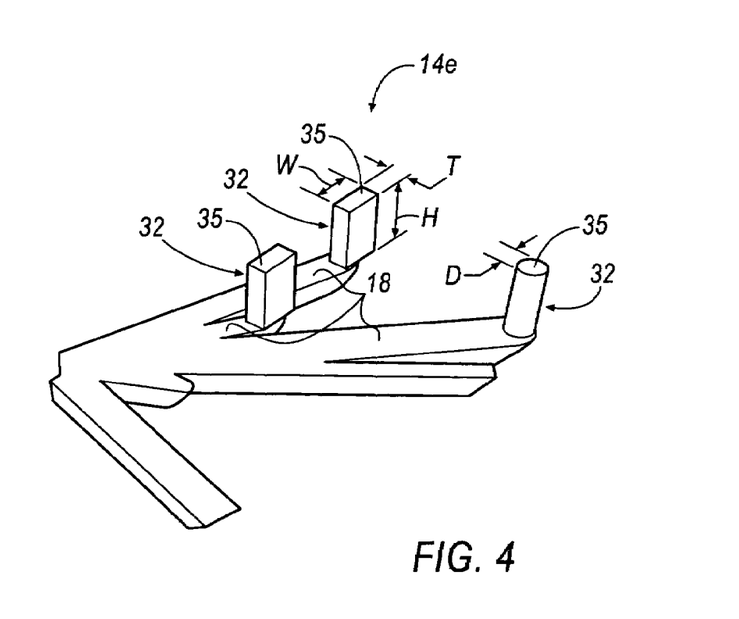
FIG. 4 is a light pipe according to an embodiment.

Referring to FIG. 3, the light pipe 14a (as well as light pipe 14c, according to FIG. 1A) include a curved internal reflection mirror, which is shown generally at reference numerals 34. According to the illustrated embodiment, the mirror 34 is formed by curved sides of the light pipe 14a, which gathers wide angle light that would otherwise not be of sufficient intensity to be used with a line-of-sight facet. Thus, the mirror 34 focuses the light, L, on a facet 22 that directs the light to a component 52-58 in the display surface 50. Although the light, L, reflecting from the facet 22 may be poorly collimated, it is sufficient to illuminate the graphic 52-58 with light, L, which would otherwise be wasted.

As also shown in FIG. 3, at least two light sources 26 emit light into the light pipe 14a. Prior to reaching the facet 22, light, L, from each light source 26 crisscrosses, or, for example, is superimposed over the light path of the other light source 26. Accordingly, the light pipe 14a permits simultaneous propagation of light from two or more light sources in a common light pipe 14a.

If the facets 22 do not completely fill the angular spread of the wedge 16, then the wedge 16 can be subdivided into the branches 18, as provided, for example, on light pipes 14b, 14c. The branches 18 form predominately parallel light guides so that the light, L, emitted at every subtended angle, $\theta_1$-$\theta_4$, comprehended by the light pipe 14b, 14c effectively terminates on a facet 22.

In the event that facets 22 are located such that a first facet 22 blocks a second facet's view of the entrance port 20, the first facet 22 can be restricted so that it does not consume the entire available thickness of the light pipe 14a-14d. Accordingly, the ratio of the height of the first facet 22 to the thickness of the light pipe 14a-14d can be varied to divvy up the light, L, between the two facets 22. Additionally, light pipes 14a-14d may incorporate the use of the internal facets 28 (FIGS. 1A and 5) if a back-lit portion of the display surface 50 is located in the general area of the wedge portion 16, which is within the line of sight 24 of an opposing facet 22. Accordingly, each internal facet 28 also includes a facet angle, $\alpha$, to direct light in a controlled manner to the display surface 50, as similarly described above with respect to the facets 22.

Figure 1A:
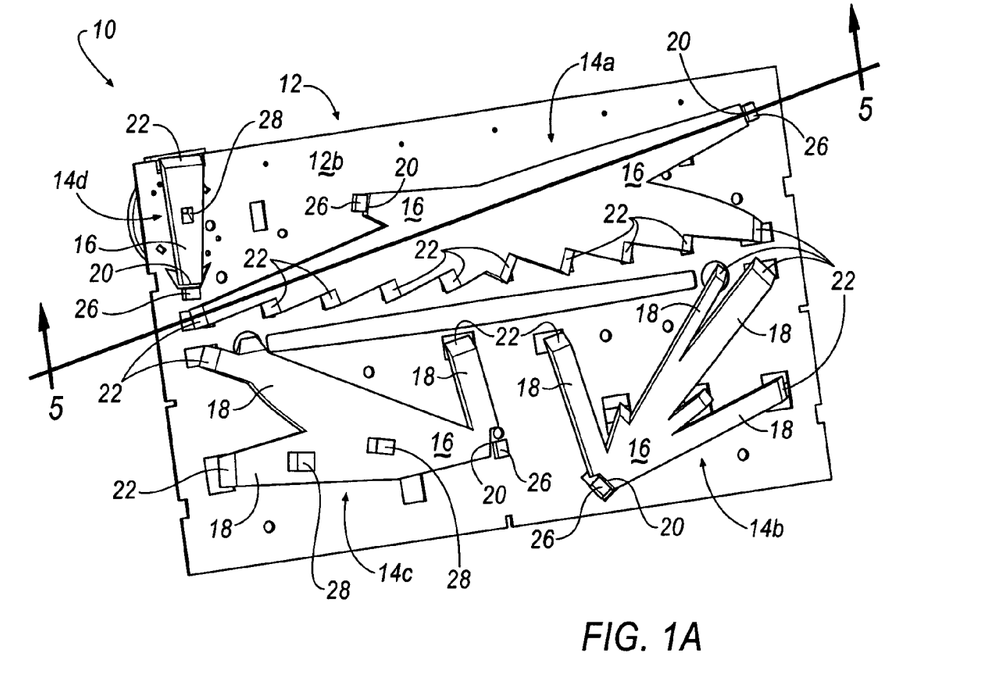
FIG. 1A is a rear perspective view of a circuit board and light pipes of an illuminated display system according to an embodiment.

Referring to FIGS. 1A and 3, one or more side-emitting light sources 26, such as, for example, light emitting diodes (LEDs), are mounted on the rear surface 12b of the circuit board 12 to provide light, L, directly into the entrance port 20 of the one or more light pipes 14a-14d. Each LED 26 emits flux per angle in a predicable fashion as the light, L, enters the light pipe 14a-14d. There is some attenuation of energy with respect to path length, $X_1$-$X_4$, within the light pipe 14a-14d; as such, facets 22 that are farther from the entrance port 20 intercept light flux as a function of the path length, $X_1$-$X_4$, the facet width, $W_1$-$W_4$, and the angular dependency of light energy with respect to subtended angle, $\theta_1$-$\theta_4$, as the light, L, is emitted from the LED 26. Thus, the luminance of a given display surface 50, can be modified by changing the facet width, $W_1$-$W_4$, and the subtended angle $\theta_1$-$\theta_4$. The subtended angle, $\theta_1$-$\theta_4$, of the LED 26 with respect to the entrance port 20 may also be varied to bias light energy towards specific facets 22. For example, the LED 26 may be directed in such a way that the highest emission direction is aimed towards facets 22 within a smaller subtended angle, $\theta_1$-$\theta_4$, whereas other facets 22 acquire light, L, from a larger subtended angle, $\theta_1$-$\theta_4$, with less emission from the LED 26.

Figure 1B:
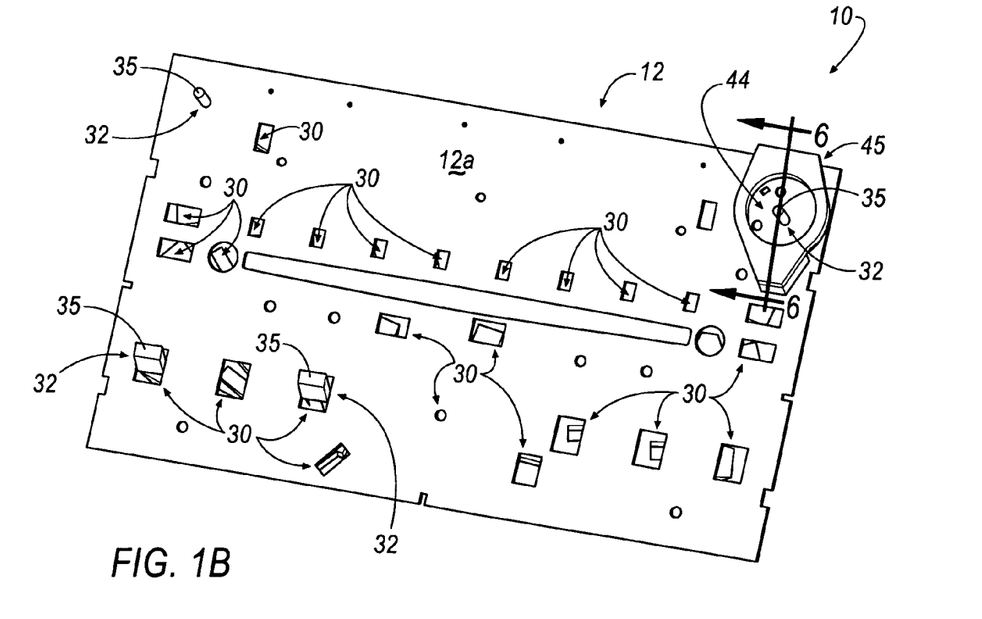
FIG. 1B is a front perspective view of the illuminated display system according to FIG. 1A.

Referring to FIG. 1B, because the one or more light pipes 14a-14d are located on the rear surface 12b of the circuit board 12, the light, L, passes through holes 30 formed in the circuit board 12 to illuminate components 52-58 of the display surface 50. In general, each facet 22 and exit port 23 is aligned with a respective hole 30, which in turn, is aligned with a specific component 52-58 of the display surface 50. Accordingly, the light, L, travels from the light source 26, to each facet 22 proximate the rear surface 12b, and then, to the exit port 23 proximate the front surface 12a, and then, through an air gap prior to reaching the component 52-58. Manufacturing tolerances often require that the air gap exists between the component 52-58 and the exit port 23 of a light pipe, and, as a result, the air gap inevitably introduces flux loss.

In an alternative embodiment, the light sources 26 may be arranged proximate the holes 30 in the circuit board to provide a direct illumination of the components 52-58 without directing the light, L, through the light pipes 14a-14d. Although the light, L, from the light sources 26 is propagating in a side-emitting relationship, some light, L, that would otherwise be wasted by reflecting off of the rear surface 12b of the circuit board 12 will be permitted to travel through the holes 30 to directly back-light the components 52-58. The amount of light, L, allowed to propagate through the circuit board 12 may be increased or decreased by the shaping and/or sizing of the holes 30 in the circuit board 12.

To overcome losses associated with larger air gaps, the light pipes 14a-14d may include, if desired, one or more substantially perpendicular riser 32, which captures light flux from the light source 26 and directs the light, L, to a desired component on the display surface 50. As seen more clearly in FIG. 4, a light pipe 14e, according to an embodiment, includes three substantially perpendicular risers 32 that extend from selected branches 18. Each riser 32 is integrally formed with the light pipe 14e and provides a riser exit port 35. As illustrated, the risers 32 may include any desirable shape, such as, for example, a cube, cylinder, truncated pyramid, or the like, and any desirable dimension including a width, W, thickness, T, height, H, or diameter, D. If desired, other various shapes may be included as well. For example, the cylinder may be split in half down a central axis to include a D-shape in cross-section. According to an embodiment, the width, W, thickness, T, and height, H, may be approximately equal to 7.4 mm, 4.0 mm, and 11.6 mm, respectively. If formed to include a cylindrical shape, the diameter, D, may be approximately equal to 3.3 mm, according to an embodiment. It will be appreciated that the invention is not limited to the above-described dimensions and that other dimensions may be included in the design of the risers 32.

Figure 5:
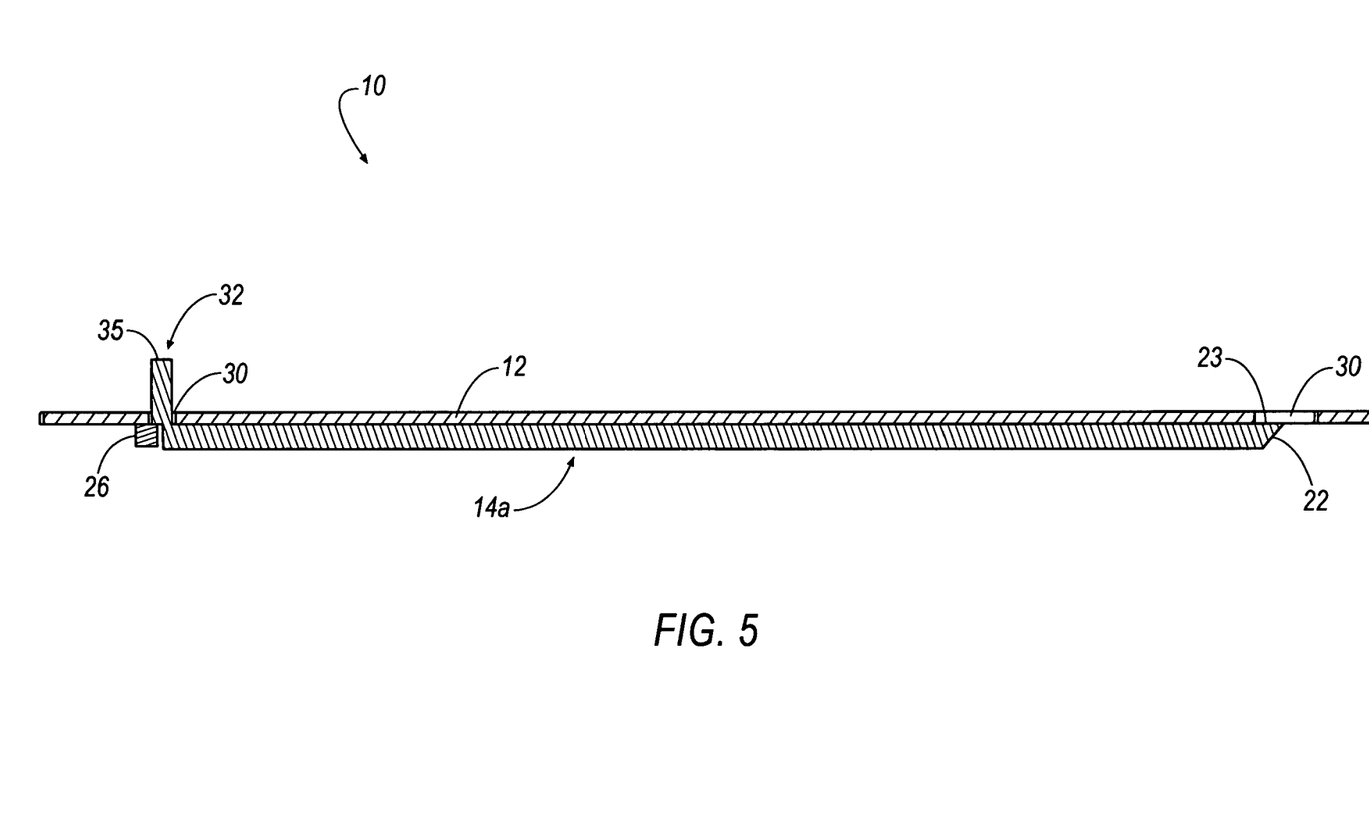
FIG. 5 is a cross-sectional view of the illuminated display system according to line 5-5 taken across FIG. 1A.
Figure 7:
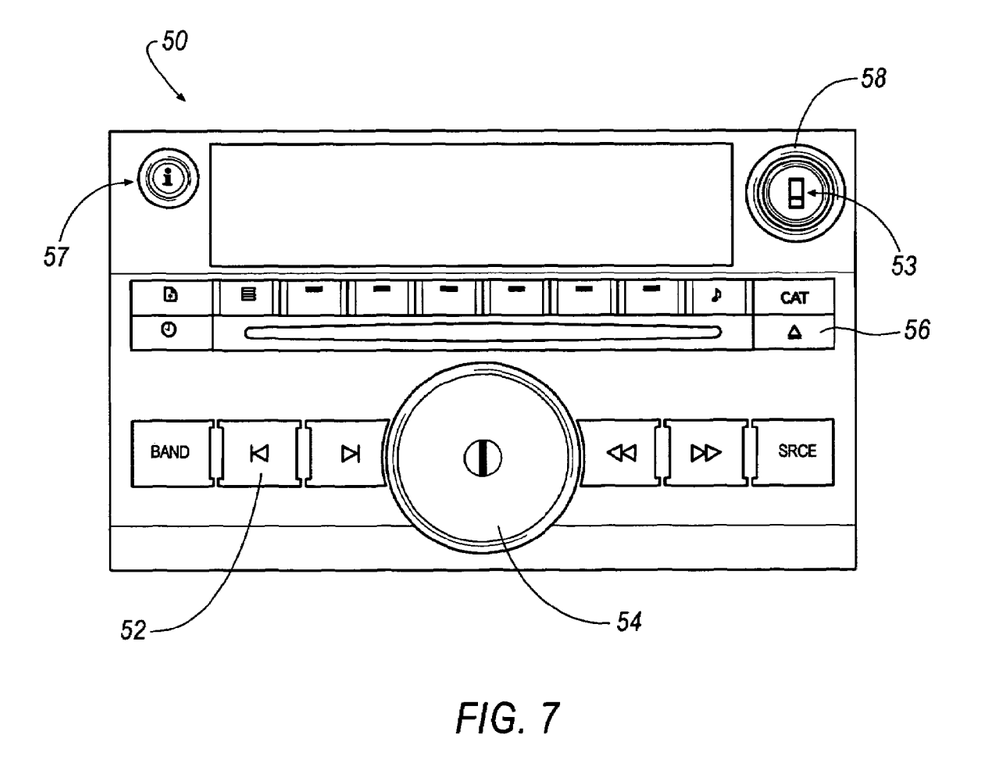
FIG. 7 is a front view of a display panel of the illuminated display system.

Referring to FIG. 1B, risers 32 are shaped to extend through the holes 30 formed in the circuit board 12. As seen more clearly in FIG. 5, when extended through the holes 30 formed in the circuit board 12, the riser exit port 35 may be positioned closer to the display surface 50 relative to the positioning of the exit ports 23 proximate the rear surface 12b of the circuit board 12. Because the riser exit ports 35 are located closer to the display surface 50, the risers 32 effectively increase efficiency by reducing losses incurred as light, L, spreads out from facets 22 toward the display surface 50 through air. Even further, as shown in FIGS. 5 and 7, because the light source 26 is located proximate the riser 32, the light, L, from the light source may directly illuminate the graphic 57. Accordingly, because the light source 26 is essentially next to the riser, the distance that the light, L, has to travel is reduced, and propagation losses are reduced. Although the risers 32 are described to be located in a position relative to an elevated component, such as the dial 58, risers 32 may be implemented and correspond to any desirable component 52-56 that does not cause a relatively larger air gap.

Figure 6:
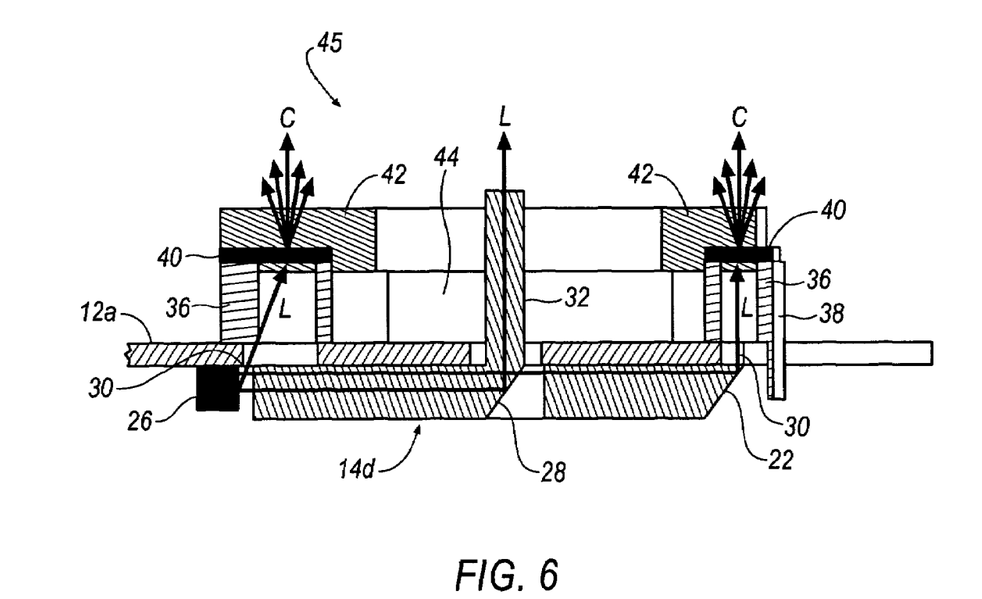
FIG. 6 is a cross-sectional view of the illuminated display system according to line 6-6 taken across FIG. 1B.

The present application is also extremely well suited for systems that use color conversion materials. Referring to FIGS. 1B and 6, a halo-illuminating structure 45 including a color converter 40 is positioned over the front surface 12a of the circuit board 12. The color converter 40 includes a fluorescent dye or pigment that absorbs the light, L, from the LED 26, which is usually somewhat directional in nature, and re-emits the light, L, isotropically to convert shorter wavelengths of the light, L, to longer wavelengths, which is generally defined at reference letter C for converted light. In such an application, the LED 26 is typically blue in color. Accordingly, the material of the color converter 40 absorbs the blue light in high frequency energy (i.e. shorter wavelengths) and re-emits a non-blue light in lower frequency energy (i.e. longer wavelengths). This process is known as "down-converting," and the resultant light spectrum produced by this process can be tuned by various fluorescent dye concentrations to render a multiplicity of desired colors. Color converting systems are described in application Ser. Nos. 10/107,766, 10/732,987, and 10/461,097, which are assigned to the assignee of the present invention.

As illustrated, the color converter 40 is capped with an upper light pipe 42 and is supported by a reflective housing 36, which includes a light-retaining end-flap 38 that inwardly reflects light, L, for containment within the halo-illuminating structure 45. The halo-illuminating structure 45 accommodates passage of a generally cylindrical riser 32 extending from the light pipe 14d about a halo structure passage 44. In operation, the upper light pipe 42 receives the light, L, through the holes 30, from the light pipe 14a via the facet 22, and through the riser 32 via the facet 28 to provide a halo-effect lighting of the light the dial 58. According to the illustrated embodiment, the graphic 53 and dial halo 58 are illuminated with a single light source 26. Additionally, the amount of light, L, used to illuminate the graphic 53 and dial halo 58 can be controlled by changing the size of the hole(s) 30 in the circuit board 12.

The design and location of the light pipes 14a-14d on the rear surface 12b of the circuit board 12 virtually reduces the number of light sources 26 used to accomplish a lighting task. The reduction of light sources 26 enables a tighter intensity and color distributions for the light sources 26 on a given circuit board 12. Even further, the reduced number of light sources 26 also allows for individual pulse width modulation (PWM) dimming for each source 26 if tighter intensity tolerances are needed across an assembly. In view of the relative positioning of the circuit board holes 30, facets 22, 28 and illuminated components 52-58 of the display surface 50, the increased light utilization of the light pipes 14a-14d translates into fewer light sources 26 called for in the design of the illuminated display system. If the traditional top side design was applied to the display surface 50, approximately twenty-two to twenty-eight LEDs would have to be implemented to provide a complete illumination for all of the components 52-58, which would generally, if not account exactly to a 1:1 ratio of light sources 26 to each component 52-58. Conversely, the present application provides a complete illumination of the components 52-58 on the display surface 50 with a substantially fewer number of LEDs, such as, for example, five LEDs 26, as illustrated.

Cost savings in relation to design time, computer simulation, prototype mold construction, and the prototyping of a working system are realized because the lighting and mechanical designs are decoupled to a greater degree in view of the prior art. Therefore, a small change in the location of electrical components or mechanical design on the front surface 12a of the circuit board 12 has little if no effect on the light pipe design and efficiency. As a result, color and intensity matching of the illuminated components 52-58 becomes a more manageable task during the design phase.

While the invention has been specifically described in connection with certain specific embodiments thereof, it is to be understood that this is by way of illustration and not of limitation, and the scope of the appended claims should be construed as broadly as the prior art will permit.

What is claimed is:

1. An illuminated display system comprising:
a circuit board including a front surface and a rear surface, wherein the circuit board includes a plurality of light-passing holes, each said light-passing hole corresponding to a location of a component of a display surface positioned over the front surface; and
at least one light pipe arranged on the rear surface of the circuit board, wherein the at least one light pipe includes at least one entrance port and a plurality of corresponding facets and exit ports, each exit port being aligned with one of said light-passing holes, each said facet being disposed adjacent the rear surface and aligned with one of said light passing holes and an exit port for redirecting light from the entrance port toward the exit port, and
a light source arranged proximate the at least one entrance port to direct light from the at least one entrance port to the plurality of facets and exit ports for passage through the plurality of light-passing holes formed in the circuit board to illuminate the components on the display surface.

2. The illuminated display system according to claim 1 wherein the light source is a side-emitting light source arranged on the rear surface of the circuit board.

3. The illuminated display system according to claim 1, wherein the at least one light pipe includes a wedge portion and one or more branches that direct light from the entrance port to the facets.

4. The illuminated display system according to claim 1, wherein the at least one light pipe includes a curved internal reflection mirror that gathers wide angle light to be used with one or more facets.

5. The illuminated display system according to claim 2, wherein each of the plurality of facets is defined to include a width, wherein each of the plurality of facets encompasses a subtended angle in reference to the normal of the emitting surface of the light source.

6. The illuminated display system according to claim 5, wherein the width increases as the subtended angle increases.

7. The illuminated display system according to claim 5, wherein each facet is defined to include a facet angle, wherein the facet angle is within a range between approximately 40°-55°.

8. The illuminated display system according to claim 1 further comprising a perpendicular riser integrally formed with the at least one light pipe, wherein the perpendicular riser extends through one of the plurality of light-passing holes to illuminate the display surface.

9. The illuminated display system according to claim 2, wherein the side-emitting light source is a first side-emitting light source and wherein the illuminated display system further comprises a second side-emitting light source, wherein the first and second side-emitting light sources emit light into the at least one light pipe and prior to reaching the plurality of facets, line of sight light paths from each first and second light source are superimposed to permit simultaneous propogation of light within the at least one light pipe.

10. The illuminated display system according to claim 2, wherein the side-emitting light source is arranged proximate the light passing hole to provide a direct illumination of the components with the light without passing the light through the at least one light pipe.

11. The illuminated display system according to claim 10, wherein the hole is sized and shaped to provide a desired amount of light for direct illumination of the component.

12. An illuminated display system comprising:
   a circuit board including a front surface and a rear surface, wherein the circuit board includes a plurality of light-passing holes;
   a first light pipe arranged on the rear surface of the circuit board; and
   a second light pipe arranged on the front surface of the circuit board, wherein light from a light source is communicated from the first light pipe through one or more light-passing holes formed in the circuit board to the second light pipe, wherein the light is communicated from the second light pipe to a display surface positioned over the front surface of the circuit board to illuminate individual components of the display surface, wherein the second light pipe is supported by a housing placed over the circuit board forming a halo-illuminating structure.

13. The illuminated display system according to claim 12, wherein the first light pipe includes at least one entrance port and one or more corresponding facets and exit ports that directs the light to the second light pipe.

14. The illuminated display system according to claim 13, wherein the one or more facets, exit ports, and light passing holes are aligned in a corresponding relationship to the location of the individual components of the display surface.

15. The illuminated display system according to claim 12, wherein the light source produces blue or ultraviolet light in high frequency energy, wherein a color converter is located between the second light pipe and housing to absorb the blue or ultraviolet light in high frequency energy for re-emission as a non-blue light in lower frequency energy.

16. The illuminated display system according to claim 12, wherein the light source is arranged proximate the light passing hole to provide a direct illumination of the components with the light without passing the light through the at least one light pipe.

17. The illuminated display system according to claim 16, wherein the hole is sized and shaped to provide a desired amount of light for direct illumination of the component.

* * * * *